United States Patent
Fujihara et al.

(10) Patent No.: US 10,386,387 B2
(45) Date of Patent: Aug. 20, 2019

(54) PROBE GUIDE PLATE AND PROBE DEVICE

(71) Applicants: SHINKO ELECTRIC INDUSTRIES CO., LTD., Nagano-shi, Nagano (JP); JAPAN ELECTRONIC MATERIALS CORPORATION, Amagasaki-shi, Hyogo (JP)

(72) Inventors: Kosuke Fujihara, Nagano (JP); Yuichiro Shimizu, Nagano (JP)

(73) Assignees: SHINKO ELECTRIC INDUSTRIES CO., LTD., Nagano-Shi (JP); JAPAN ELECTRONIC MATERIALS CORPORATION, Amagasaki-Shi (JP)

( * ) Notice: Subject to any disclaimer, the term of this patent is extended or adjusted under 35 U.S.C. 154(b) by 298 days.

(21) Appl. No.: 15/404,832

(22) Filed: Jan. 12, 2017

(65) Prior Publication Data
US 2017/0205444 A1 Jul. 20, 2017

(30) Foreign Application Priority Data
Jan. 14, 2016 (JP) ................. 2016-004970

(51) Int. Cl.
*G01R 1/073* (2006.01)
*G01R 3/00* (2006.01)

(52) U.S. Cl.
CPC ........... *G01R 1/07371* (2013.01); *G01R 3/00* (2013.01)

(58) Field of Classification Search
CPC .............................. G01R 1/07371; G01R 3/00
USPC ................................ 324/750.25, 252, 207.21
See application file for complete search history.

(56) References Cited

U.S. PATENT DOCUMENTS

| | | | | |
|---|---|---|---|---|
| 6,528,780 B1* | 3/2003 | Mitsuoka | ............... | B82Y 20/00 250/216 |
| 6,593,235 B2* | 7/2003 | Uochi | ............... | H01L 21/76804 257/E21.413 |
| 2002/0004320 A1* | 1/2002 | Pedersen | ............... | B23K 1/0016 439/66 |
| 2007/0259506 A1* | 11/2007 | Hoshino | ............ | G01R 1/06716 438/400 |
| 2008/0217791 A1* | 9/2008 | Kojima | ................... | H01L 22/32 257/774 |
| 2010/0231249 A1* | 9/2010 | Dang | ................... | G01R 1/0675 324/754.18 |
| 2014/0266275 A1 | 9/2014 | Kimura et al. | | |
| 2015/0091596 A1* | 4/2015 | Kister | ............... | G01R 1/07314 324/750.25 |
| 2015/0204911 A1* | 7/2015 | Funk | ................... | G01R 31/2889 324/750.25 |

(Continued)

FOREIGN PATENT DOCUMENTS

| JP | 2007-057447 | 3/2007 |
|---|---|---|
| JP | 2014-071069 | 4/2014 |
| JP | 2014-181910 | 9/2014 |

*Primary Examiner* — Giovanni Astacio-Oquendo
(74) *Attorney, Agent, or Firm* — Rankin, Hill & Clark LLP

(57) ABSTRACT

A probe guide plate includes a first silicon substrate having first through-holes formed therein, an insulation layer formed on the first silicon substrate and having an opening on a region in which the first through-holes are arranged, a second silicon substrate arranged on the insulation layer and having second through-holes formed at positions corresponding to the first through-holes, and a silicon oxide layer formed on exposed surfaces of the first silicon substrate and the second silicon substrate.

13 Claims, 13 Drawing Sheets

(56) References Cited

U.S. PATENT DOCUMENTS

2015/0301083 A1* 10/2015 Kimura .............. G01R 1/07357
324/750.25

* cited by examiner

ANISOTROPIC DRY ETCHING

PROBE GUIDE PLATE AND PROBE DEVICE

CROSS-REFERENCE TO RELATED APPLICATION

The present application claims priority from Japanese Patent Application No. 2016-004970 filed on Jan. 14, 2016, the entire content of which is incorporated herein by reference.

BACKGROUND

Technical Field

The present disclosure relates to a probe guide plate, a method of manufacturing the probe guide plate and a probe device.

Related Art

Electric characteristics of a testing target such as a semiconductor device are measured by bringing probe terminals of a probe device into contact with a plurality of electrode pads of the testing target for electrical conduction. The probe device has a probe guide plate having through-holes formed therein, and the probe terminals are inserted into the through-holes of the probe guide plate, so that the probe terminals are positioned.

[Patent Document 1] Japanese Patent Application Publication No. 2007-57447A
[Patent Document 2] Japanese Patent Application Publication No. 2014-71069A
[Patent Document 3] Japanese Patent Application Publication No. 2014-181910A As the probe guide plate used for the probe device, a probe guide plate having two guide plates bonded to each other via a spacer so as to improve strength has been known. In order to manufacture the probe guide plate, it is necessary to separately manufacture the two guide plates and the spacer and to assemble the same. For this reason, the cost increases and lead time of the manufacturing also increases.

Also, since the two guide plates and the spacer are assembled through the bonding, the position precision of the through-holes of the upper and lower guide plates is low. For this reason, particularly, when diameters and an arrangement pitch of the through-holes decrease, the probe terminals may not be skillfully inserted into the upper and lower through-holes.

SUMMARY

Exemplary embodiments of the invention provide a novel probe guide plate of which two guide plates are stacked with high position precision at low cost, a method of manufacturing the probe guide plate and a probe device.

A probe guide plate according to an exemplary embodiment of the invention comprises:
a first silicon substrate having first through-holes formed therein;
an insulation layer formed on the first silicon substrate and having an opening on a region in which the first through-holes are arranged;
a second silicon substrate arranged on the insulation layer and having second through-holes formed at positions corresponding to the first through-holes; and
a silicon oxide layer formed on exposed surfaces of the first silicon substrate and the second silicon substrate.

A probe device according to an exemplary embodiment of the invention comprises:
a probe guide plate comprising:
a first silicon substrate having first through-holes formed therein,
an insulation layer formed on the first silicon substrate and having an opening on a region in which the first through-holes are arranged,
a second silicon substrate arranged on the insulation layer and having second through-holes formed at positions corresponding to the first through-holes, and
a silicon oxide layer formed on exposed surfaces of the first silicon substrate and the second silicon substrate; and
probe terminals inserted into the first through-holes from the second through-holes of the probe guide plate.

The insulation layer may be a silicon oxide layer.

A manufacturing method of a probe guide plate according to an exemplary embodiment of the invention, comprises:
preparing a silicon multi-layer substrate in which a first silicon substrate, an insulation layer and a second silicon substrate are stacked in corresponding order;
forming first through-holes in the first silicon substrate and forming second through-holes in the second silicon substrate in random order and arranging the first through-holes and the second through-hole at positions corresponding to each other;
etching the insulation layer by an isotropic etching and forming an opening of the insulation layer on a region in which the first through-holes are arranged; and
forming a silicon oxide layer on exposed surfaces of the first silicon substrate and the second silicon substrate.

According to the present invention, the probe guide plate is manufactured using the silicon multi-layer substrate of which the first silicon substrate, the first silicon oxide layer and the second silicon substrate are stacked in corresponding order. Based on the photolithography, the first silicon substrate and the second silicon substrate are formed with the first through-holes and the second through-holes with being positioned.

Also, the first silicon oxide layer is isotropically etched, so that the opening of the first silicon oxide layer is formed on the region in which the first through-holes of the first silicon substrate are arranged.

Thereby, as compared to the method of bonding the two guide plates separately manufactured via the spacer, it is possible to increase the position precision of the upper and lower through-holes, to save the cost and to shorten the lead time of the manufacturing.

Also, in the favorable aspect, the notch portions are formed at the upper end portions of the inner walls of the first through-holes of the first silicon substrate, so that an opening diameter is large. For this reason, even when the first through-holes and the second through-holes are arranged with deviating from each other, it is possible to smoothly insert the probe terminals from the second through-holes into the first through-holes.

DETAILED DESCRIPTION

Hereinafter, exemplary embodiments will be described with reference to the accompanying drawings.

(First Exemplary Embodiment)

Figure 4A:
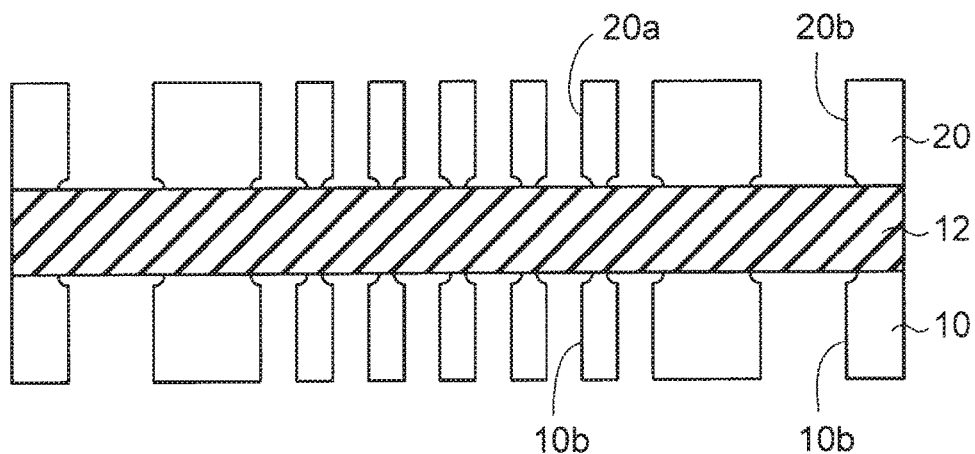
FIGS. 4A and 4B are sectional views depicting the manufacturing method of the probe guide plate in accordance with the first exemplary embodiment (4 thereof).
Figure 4B:
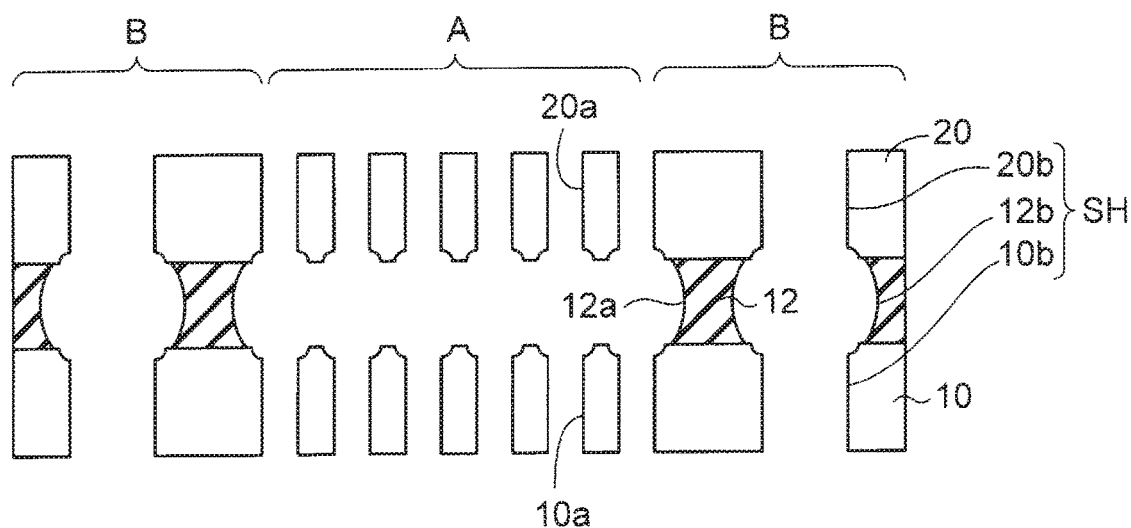
Figure 5:
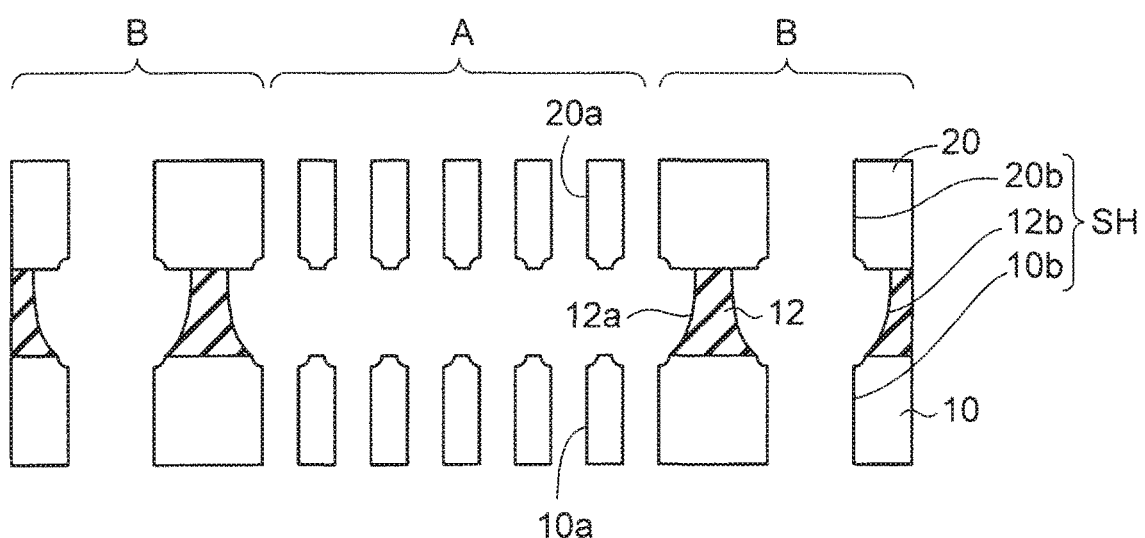
FIG. 5 is a sectional view depicting the manufacturing method of the probe guide plate in accordance with the first exemplary embodiment (5 thereof).
Figure 6:
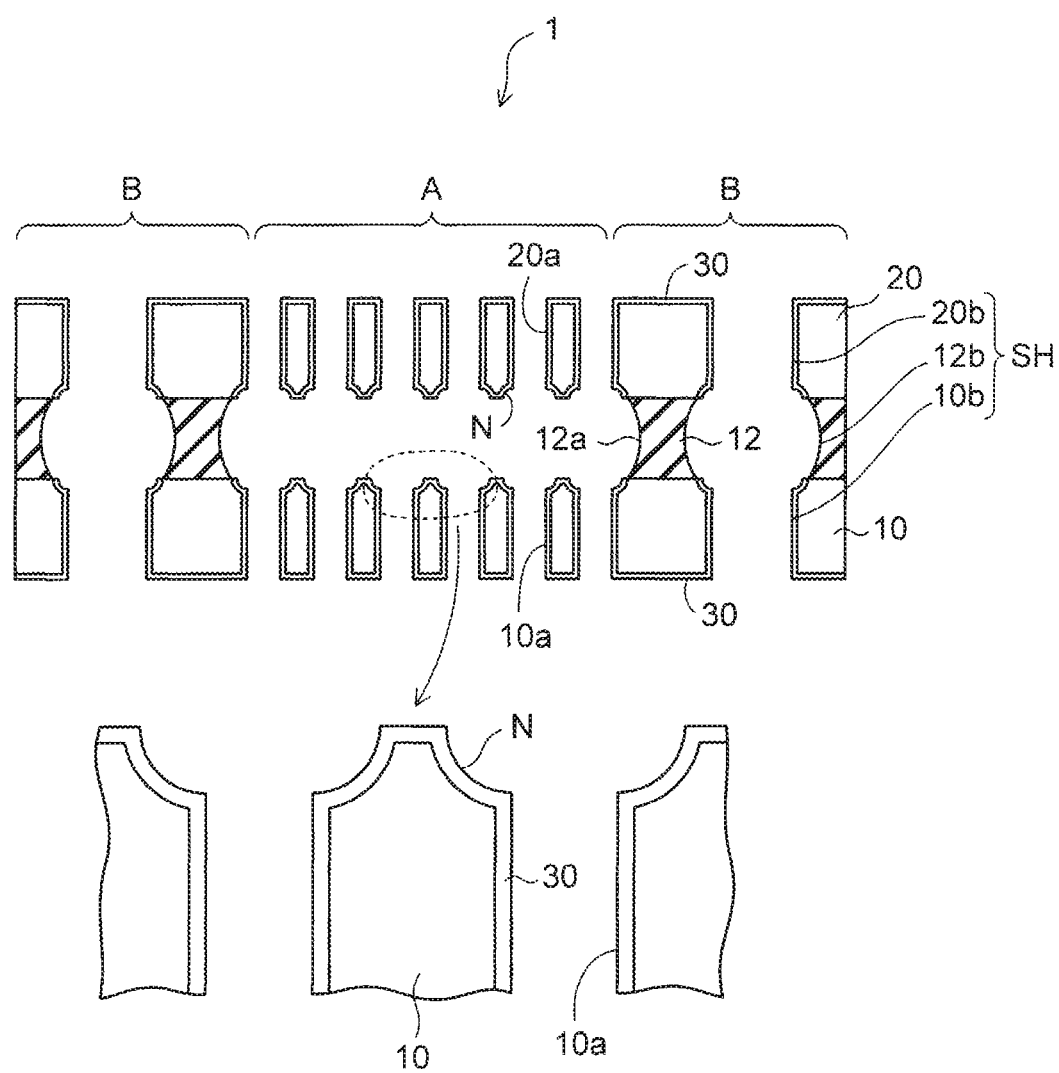
FIG. 6 is a sectional view depicting the probe guide plate of the first exemplary embodiment.
Figure 7:
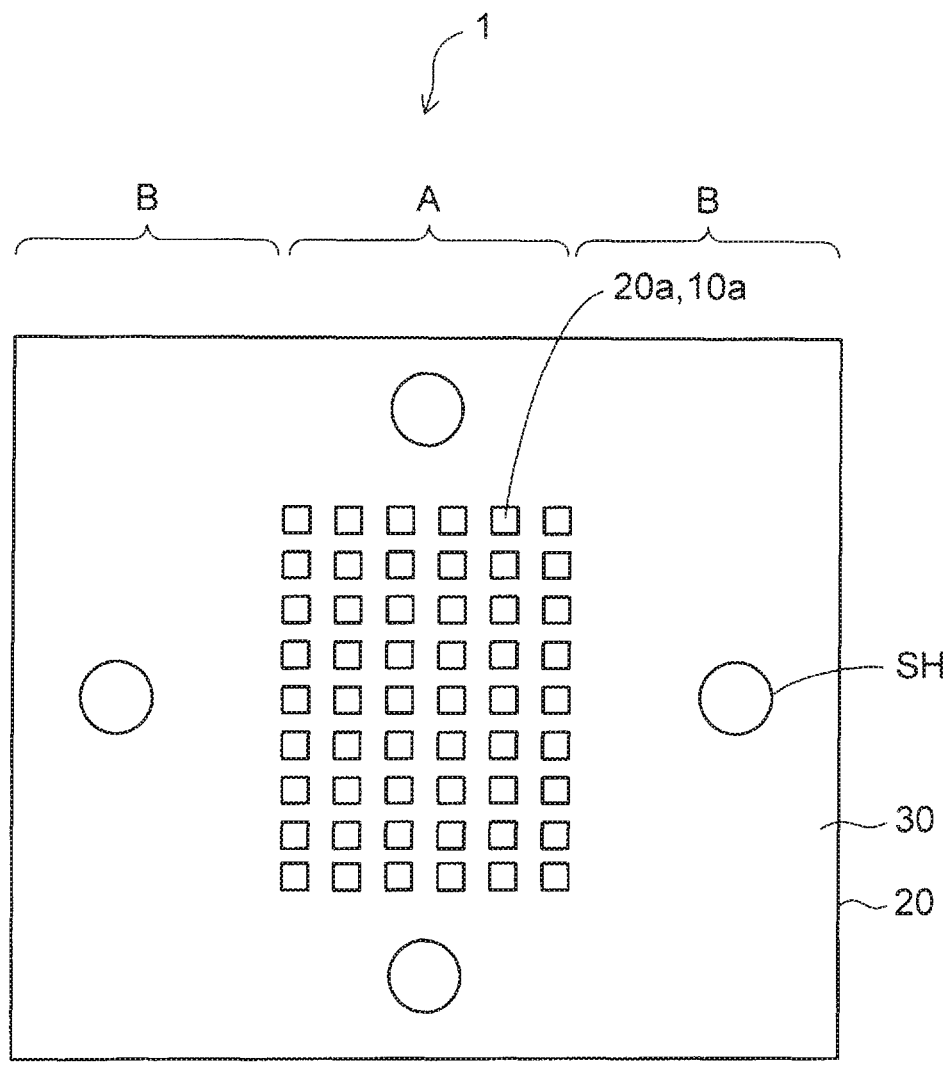
FIG. 7 is a plan view depicting the probe guide plate of the first exemplary embodiment.
Figure 8:
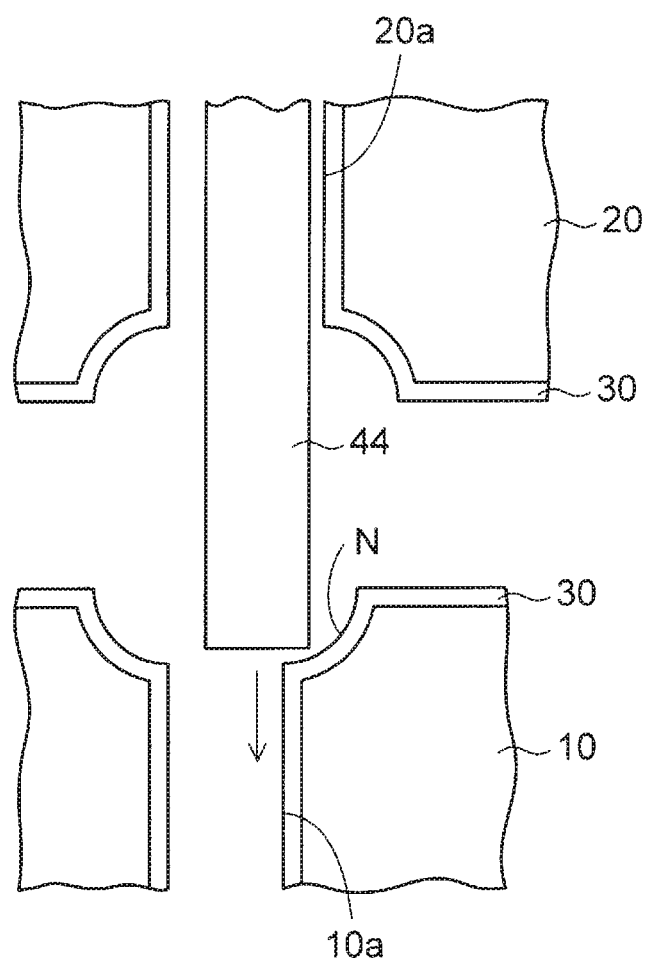
FIG. 8 is a sectional view depicting a situation where a probe terminal is being inserted into upper and lower through-holes of the probe guide plate of the first exemplary embodiment.
Figure 9:
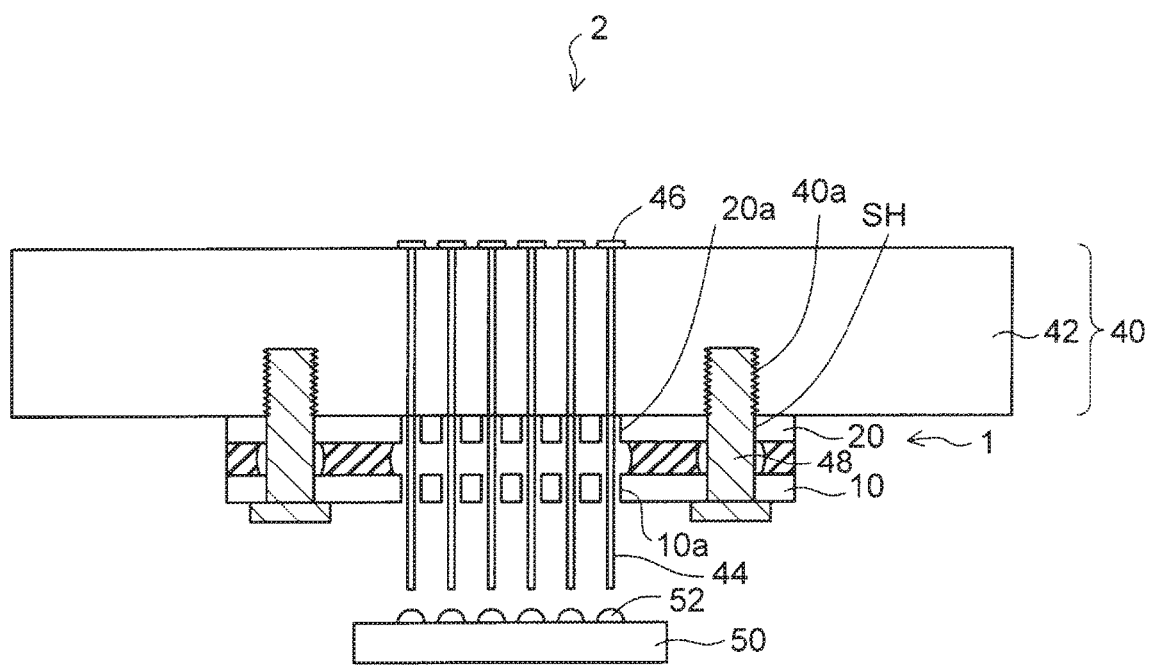
FIG. 9 is a sectional view depicting a probe device of the first exemplary embodiment.

FIGS. 1A to 5 illustrate a manufacturing method of a probe guide plate of a first exemplary embodiment, FIGS. 6 to 8 illustrate the probe guide plate of the first exemplary embodiment, and FIG. 9 illustrates a probe device of the first exemplary embodiment. In the below, while describing the manufacturing method of the probe guide plate, structures of the probe guide plate and the probe device are described.

Figure 1A:
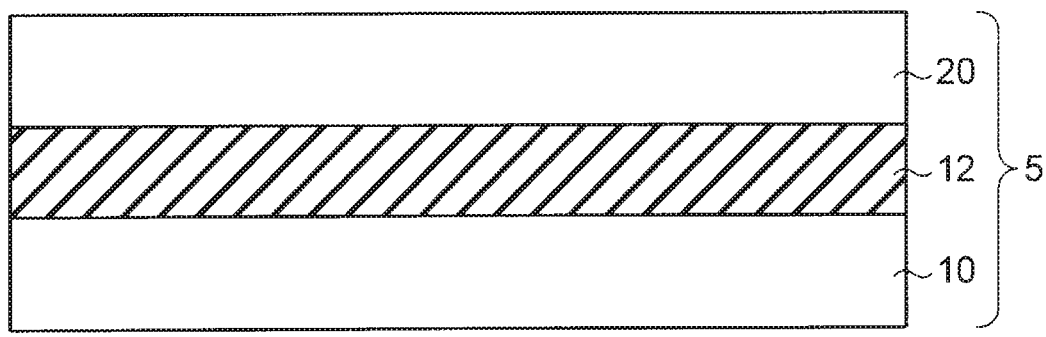
FIGS. 1A and 1B are sectional views depicting a manufacturing method of a probe guide plate in accordance with a first exemplary embodiment (1 thereof).

In the manufacturing method of the probe guide plate of the first exemplary embodiment, as shown in FIG. 1A, a silicon multi-layer substrate 5 of which a first silicon substrate 10, a first silicon oxide layer 12 and a second silicon substrate 20 are stacked in corresponding order from below is first prepared.

As the first silicon substrate 10 and the second silicon substrate 20, a silicon wafer having a thickness of about 100 μm to 500 μm is used. A backside of a silicon wafer having a thickness of about 600 μm to 800 μm is grinded and adjusted to a required thickness by a back grinder apparatus. Also, a thickness of the first silicon oxide layer 12 is about 3 μm to 500 μm.

As the silicon multi-layer substrate 5, an SOI (Silicon On Insulator) substrate is used, for example. In this case, the first silicon oxide layer 12 is formed on a surface of the first silicon substrate 10 by thermal oxidization. Then, the second silicon substrate 20 is directly bonded on the first silicon oxide layer 12 on the surface of the first silicon substrate 10 by anodic bonding. A thickness of the first silicon oxide layer 12 formed by the thermal oxidization is about 3 μm to 20 μm.

Alternatively, when the first silicon oxide layer 12 of which the thickness is greater than 20 μm is used, the first silicon oxide layer 12 is formed of a glass substrate. The glass substrate consists of silicon dioxide, which is the same insulating material as the first silicon oxide layer 12.

When the glass substrate is used as the first silicon oxide layer 12, the second silicon substrate 20 is first stacked on the first silicon substrate 10 via the glass substrate. Then, the first silicon substrate 10 and second silicon substrate 20 and the glass substrate are directly bonded by the anodic bonding, respectively.

A plurality of product regions is defined in the first and second silicon substrates 10, 20. In FIG. 1A and thereafter, one product region is partially shown.

Figure 1B:
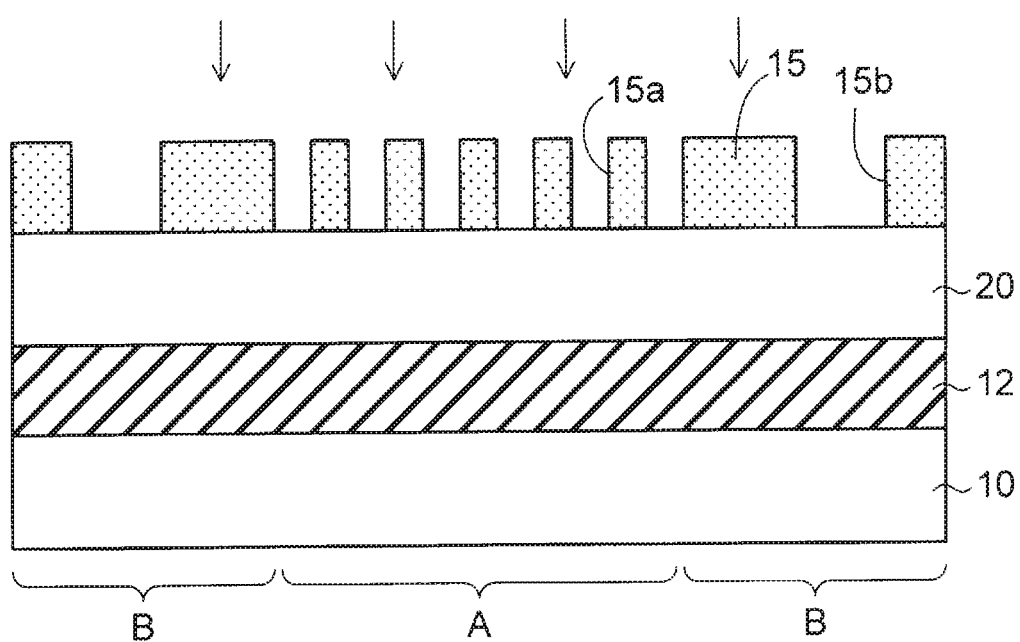

Then, as shown in FIG. 1B, a resist layer 15 having first openings 15a and second openings 15b, which have respectively a hole shape, is formed on the second silicon substrate 20 by patterning.

The small-diameter first openings 15a for forming through-holes are arranged at a central part A of the second silicon substrate 20. Also, the large-diameter second openings 15b for forming through-holes for screw are arranged at a peripheral edge portion B of the second silicon substrate 20.

The resist layer 15 is formed by applying liquid resist, exposing the resist via a photomask on the basis of photolithography and then developing the same. Alternatively, the resist layer 15 may be formed using a dry film resist.

Figure 2A:
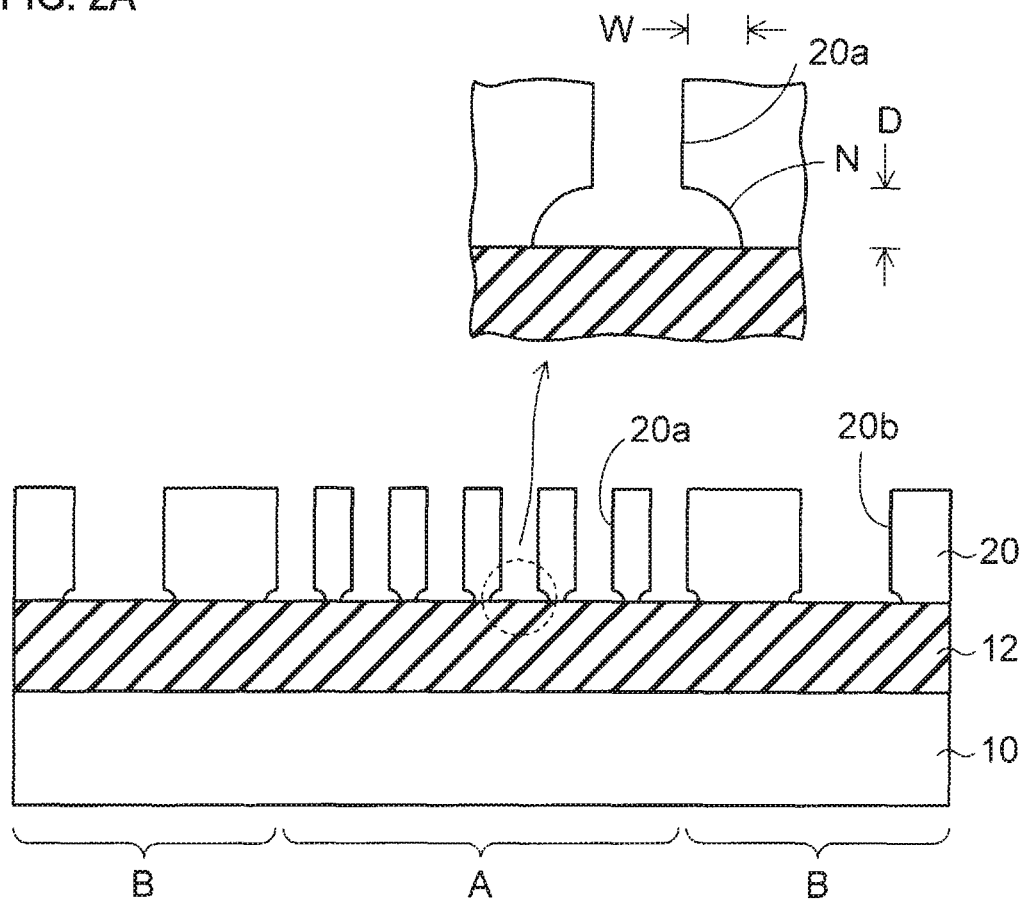
FIGS. 2A and 2B are sectional views depicting the manufacturing method of the probe guide plate in accordance with the first exemplary embodiment (2 thereof).

Subsequently, as shown in FIGS. 1B and 2A, the second silicon substrate 20 is etched up to the first silicon oxide layer 12 by an anisotropic dry etching via the first openings 15a and the second openings 15b of the resist layer 15. Then, the resist layer 15 is removed.

As the anisotropic dry etching, a DRIE (Deep Reactive Ion Etching) using $SF_6$-based gas or the like is used.

Thereby, as shown in FIG. 2A, second through-holes 20a penetrating the second silicon substrate 20 from an upper surface to a lower surface are formed at the central part A of the second silicon substrate 20. The second through-holes 20a are formed at positions corresponding to the first openings 15a of the resist layer 15.

Also, opening holes 20b for forming through-holes for screw are formed at the peripheral edge portion B of the second silicon substrate 20 at the same time. The opening holes 20b are formed at positions corresponding to the second openings 15b of the resist layer 15.

At this time, as shown in a partially enlarged sectional view of FIG. 2A, a lower end portion of an inner wall of the second through-hole 20a is side-etched outward, so that a notch portion N having a notched shape is formed at the lower end portion of the inner wall of the second through-hole 20a.

The reason is described. When the etching of the second silicon substrate 20 is over and an over etching is performed, the first silicon oxide layer 12, which is an insulator, is exposed to bottoms of the second through-holes 20a. For this reason, positive (+) ions of plasma remain on the bottoms of the second through-holes 20a and diffuse outward, so that the inner walls of the second through-holes 20a are etched.

When a conductor layer such as a metal layer is arranged instead of the first silicon oxide layer 12, positive (+) ions flow from the bottoms of the second through-holes 20a to the conductor layer. Therefore, the notch portion N is not formed at the lower end portion of the inner wall of the second through-hole 20a.

For example, when a thickness of the second silicon substrate 20 is about 100 μm and an over etching amount is set to 20%, the notch portion N of which a width W is about 10 μm and a depth D is about 10 μm is formed.

Figure 2B:
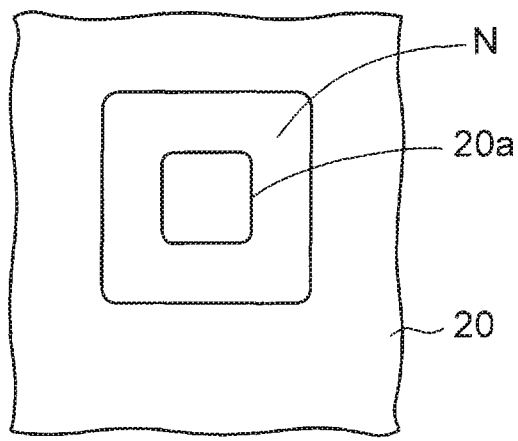

FIG. 2B is a partially enlarged plan view of the notch portion N, which is formed at the inner wall of the second through-hole 20a of the partially enlarged sectional view of FIG. 2A, as seen from below. As shown in FIG. 2B, the second through-hole 20a has a rectangular shape, as seen from below, and the notch portion N is formed with being annularly connected in a surrounding region of the lower end portion of the inner wall of the second through-hole 20a.

A size of the second through-hole 20a is about 20 μm×20 μm to 100 μm×100 μm, for example. Also, an arrangement pitch of the second through-holes 20a is set to 40 μm to 150 μm, for example.

A planar shape of the second through-hole 20a may be circular, elliptical or the like, in addition to the rectangular shape.

Figure 3A:
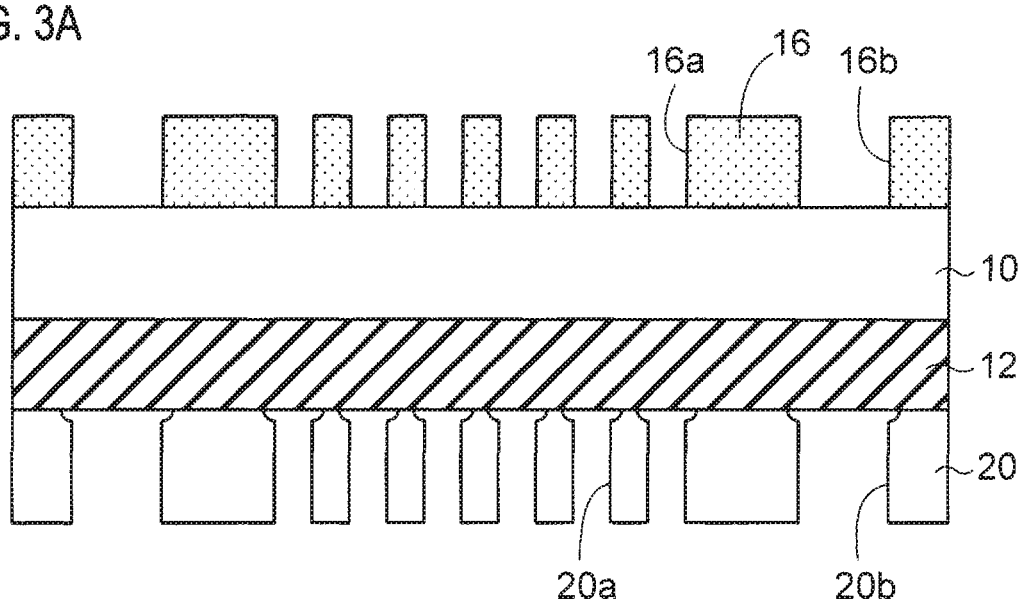
FIGS. 3A and 3B are sectional views depicting the manufacturing method of the probe guide plate in accordance with the first exemplary embodiment (3 thereof).

Then, as shown in FIG. 3A, the structure of FIG. 2A is vertically inverted, so that the first silicon substrate 10 is arranged at the upper side. Then, like the process of FIG. 1B, a resist layer 16 having first openings 16a and second openings 16b, which have respectively a hole shape, is formed on an upper surface of the first silicon substrate 10 by patterning.

At this time, an alignment mark (not shown) formed on the second silicon substrate 20 is image-recognized from below by a CCD camera (not shown), so that the positioning by the photolithography is performed.

Thereby, the first openings 16a and second openings 16b of the resist layer 16a are arranged with respect to the second through-holes 20a and opening holes 20b of the second silicon substrate 20 with high position precision.

Also, the first silicon substrate 10 is etched up to the first silicon oxide layer 12 by the anisotropic dry etching through the first openings 16a and second openings 16b of the resist layer 16, in the same manner as the process of FIG. 2A. Then, the resist layer 16 is removed.

Figure 3B:
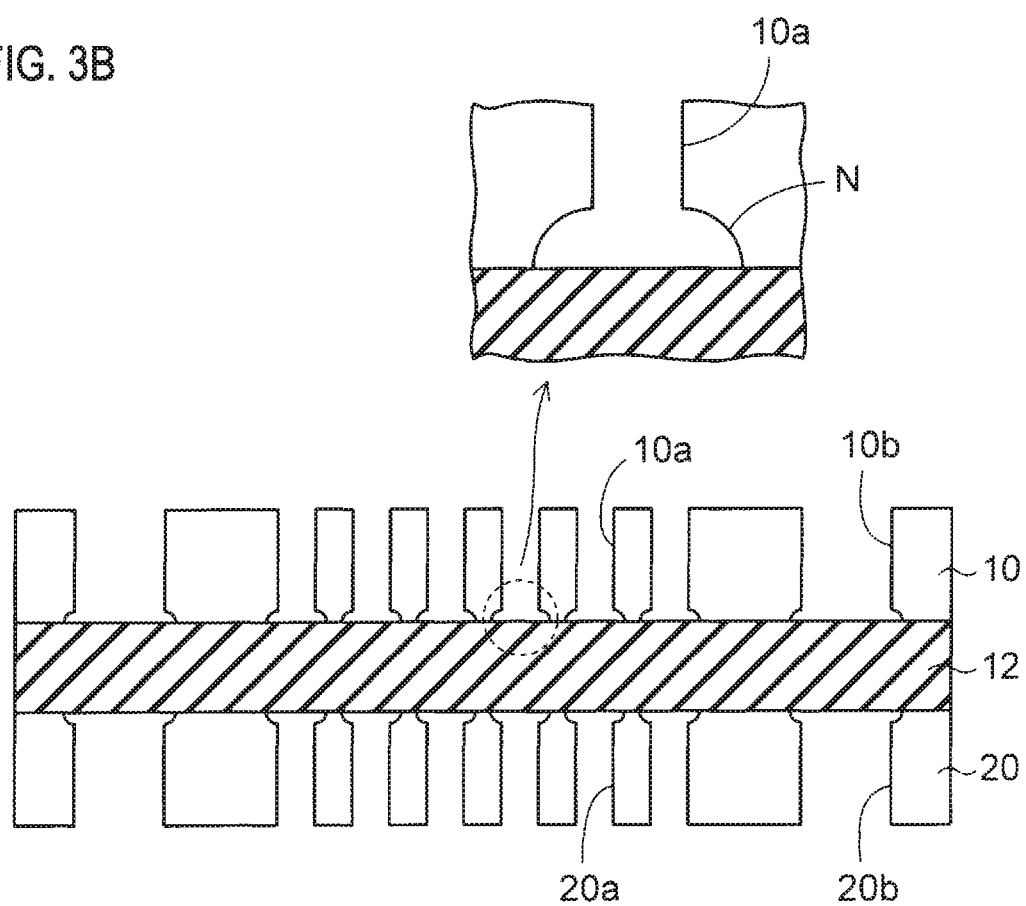

Thereby, as shown in FIG. 3B, first through-holes 10a penetrating the first silicon substrate 10 from an upper surface to a lower surface are formed in the first silicon substrate 10. At this time, as shown in a partially enlarged sectional view of FIG. 3B, a notch portion N having a notched shape is formed at a lower end portion of an inner wall of the first through-hole 10a, like FIG. 2A.

Also, as the same time, opening holes 10b for forming through-holes for screw are formed at positions of the first silicon substrate 10, which correspond to the opening holes 20b of the second silicon substrate 20.

In this way, the first through-holes 10a of the first silicon substrate 10 and the second through-holes 20a of the second silicon substrate 20 are formed at the positions at which they corresponds to each other. The first through-holes 10a and the second through-holes 20a are arranged with high position precision by a positioning technology used for the photolithography.

For this reason, it is possible to suppress a position deviation amount between the first through-holes 10a of the first silicon substrate 10 and the second through-holes 20a of the second silicon substrate 20 to about 10 μm or less, for example.

In the above example, after forming the second through-holes 20a in the second silicon substrate 20, the first through-holes 10a are formed in the first silicon substrate 10. However, the processes of forming the first through-holes 10a and the second through-holes 20a are in random order. That is, the second through-holes 20a may be formed in the second silicon substrate 20 after forming the first through-holes 10a in the first silicon substrate 10.

Like this, the notch portions N are respectively formed at the end portions of the respective inner walls, which face toward the first silicon oxide layer 12, of the first through-holes 10a and the second through-holes 20a.

Subsequently, as shown in FIG. 4A, the structure of FIG. 3B is vertically inverted, so that the first silicon substrate 10 is arranged at the lower side.

Then, as shown in FIG. 4B, the first silicon oxide layer 12 exposed from the first silicon substrate 10 and the second silicon substrate 20 is etched by a dry etching using a hydrogen fluoride (HF) gas.

By evaporating a hydrogen fluoride (HF) solution through heating and ejecting the etching gas, it is possible to easily etch the first silicon oxide layer 12 arranged at bottoms of the first and second through-holes 10a, 20a having a high aspect ratio by an isotropic etching.

In FIG. 4B, an example where the first silicon oxide layer 12 is etched by ejecting the hydrogen fluoride (HF) gas to both surfaces of the first silicon oxide layer 12 at the same time. In this case, the first silicon oxide layer 12 is etched at the same time from both surfaces thereof by the isotropic etching, through the first through-holes 10a and opening holes 10b of the first silicon substrate 10 and the second through-holes 20a and opening holes 20b of the second silicon substrate 20.

At the central part A in which the plurality of first and second through-holes 10a, 20a is arranged, arrangement pitches of the first and second through-holes 10a, 20a are set narrow. For this reason, upper and lower surfaces of the first silicon oxide layer 12, which is arranged at the bottoms of the upper and lower first and second through-holes 10a, 20a, are etched at the same time in vertical and horizontal directions, so that etching surfaces progressing from the bottoms of the upper and lower first and second through-holes 10a, 20a finally communicate with each other.

Thereby, the first silicon oxide layer 12 at the central part A in which the plurality of first and second through-holes 10a, 20a is arranged is all etched and removed, so that a collective opening 12a is formed at a central part of the first silicon oxide layer 12.

In this way, the collective opening 12a of the first silicon oxide layer 12 is formed on the region in which the plurality of first through-holes 10a of the first silicon substrate 10 is arranged. The first through-holes 10a and the second through-holes 20a are arranged to face each other via a space in the opening 12a of the first silicon oxide layer 12.

Since the first silicon oxide layer 12 is isotropically etched, an inner wall of the opening 12a of the first silicon oxide layer 12 is arranged at an outermore side than the first through-holes 10a and the second through-holes 20a.

Also, at the same time, at the peripheral edge portion B in which the opening holes 10b, 20b of the first and second silicon substrates 10, 20 are arranged, the upper and lower surfaces of the first silicon oxide layer 12 are isotropically etched from the bottoms of the upper and lower opening holes 10b, 20b, so that opening holes 12b are formed in the first silicon oxide layer 12.

The opening holes 12b of the first silicon oxide layer 12 communicate with the opening holes 10b, 20b of the first and second silicon substrates 10, 20, so that through-holes for screw SH are formed.

Since the first silicon oxide layer 12 of an inner wall of the through-hole for screw SH is formed by the isotropic etching, it is formed to have an undercut shape extending outward from the opening holes 10b, 20b of the first and second silicon substrates 10, 20.

At the peripheral edge portion B of the first and second silicon substrates 10, 20, the opening holes 10b, 20b of the first and second silicon substrates 10, 20 are arranged with a wide interval. For this reason, the opening holes 12b of the first silicon oxide layer 12 are simply formed through a side etching facing outward from the inner walls of the opening holes 10b, 20b of the first and second silicon substrates 10, 20.

Thereby, the first silicon oxide layer 12 is left as an insulation layer at the peripheral edge portion B of a region between the first silicon substrate 10 and the second silicon substrate 20.

In the first exemplary embodiment, when forming the first and second through-holes 10a, 20a in the first silicon substrate 10 and the second silicon substrate 20, the openings 10b, 20b for through-holes for screw are formed at the same time. Thereby, when forming the opening 12a in the first silicon oxide layer 12, the opening holes 12b for through-holes for screw are formed at the same time, so that it is possible to establish the through-holes SH for screw.

FIG. 5 depicts an example where the first silicon oxide layer 12 is etched by ejecting the hydrogen fluoride (HF) gas only from the upper-side second through-holes 20a.

In this case, the first silicon oxide layer 12 is etched by the isotropic etching so that it is penetrated from the upper surface to the lower surface through the second through-holes 20a and the opening holes 20b.

Thereby, like FIG. 4B, the first silicon oxide layer 12 at the central part A in which the plurality of first and second through-holes 10a, 20a is arranged is all etched and removed, so that a collective opening 12a is formed at a central part of the first silicon oxide layer 12. Also, likewise, opening holes 12b for through-holes for screw are formed in the first silicon oxide layer 12 at the same time, so that through-holes for screw SH are established.

Also, like FIG. 4B, an inner wall of the opening 12a of the first silicon oxide layer 12 is arranged at an outermore side than the first through-holes 10a and the second through-holes 20a. Also, likewise, the first silicon oxide layer 12 of the inner wall of the through-hole for screw SH is formed to have an undercut shape.

Alternatively, the first silicon oxide layer 12 may be etched by ejecting the hydrogen fluoride (HF) gas only from the lower-side first through-holes 10a. In this case, the respective inner wall surfaces of the opening 12a and opening hole 12b of the first silicon oxide layer 12 have a vertically inverted shape of FIG. 5.

Alternatively, the first silicon oxide layer 12 may be etched partially in a thickness direction only from one of the first through-holes 10a and the second through-holes 20a and then etched from the other until the first silicon oxide layer 12 communicates with an etched surface etched from the one.

Like this, in the process of forming the opening 12a and the opening holes 12b in the first silicon oxide layer 12, the first silicon oxide layer 12 may be etched at the same time from both surfaces or may be etched so that it is penetrated from any one surface thereof.

Also, the first silicon oxide layer 12 may be etched partially in the thickness direction from any one surface and then etched from the other surface until it is penetrated.

In the meantime, when there is no particular problem, the first silicon oxide layer 12 may be etched to form the opening 12a and the opening holes 12b by a wet etching in which a solution including the hydrogen fluoride is used as an etchant.

In the first exemplary embodiment, an aspect where a probe guide plate is manufactured using the structure of FIG. 4B is described.

As shown in FIG. 6, the structure of FIG. 4B is thermally oxidized to form a second silicon oxide layer 30 on exposed surfaces of the first silicon substrate 10 and the second silicon substrate 20. A thickness of the second silicon oxide layer 30 is set to 0.5 μm to 7 μm, for example.

Then, a cutting process is performed from the upper surface of the first silicon substrate 10 to the lower surface of the second silicon substrate 20 so that an individual product region is obtained.

By the above, a probe guide plate 1 of the first exemplary embodiment is manufactured, as shown in FIG. 6.

As described above, in the manufacturing method of the probe guide plate 1, the silicon multi-layer substrate 5 in which the first silicon substrate 10, the first silicon oxide layer 12 and the second silicon substrate 20 are stacked in corresponding order is used.

Then, based on the photolithography, the first through-holes 10a and the second through-holes 20a are respectively formed with being positioned in the first silicon substrate 10 and the second silicon substrate 20.

Also, the first silicon oxide layer 12 is isotropically etched through the first through-holes 10a and the second through-holes 20a, so that the opening 12a of the first silicon oxide layer 12 is formed on the region in which the first through-holes 10a of the first silicon substrate 10 are arranged.

In this way, the silicon multi-layer substrate 5 is processed on the basis of the photolithography, so that it is possible to easily manufacture the integral probe guide plate having the two guide plates stacked therein without performing an assembling process.

For this reason, as compared to a method of bonding two guide plates separately manufactured via a spacer, it is possible to increase the position precision of the upper and lower through-holes, to save the cost and to shorten the lead time of the manufacturing.

Also, since the first silicon substrate 10 and second silicon substrate 20 and the first silicon oxide layer 12 are directly bonded and integrated without using an adhesive, the probe guide plate 1 has high stiffness.

As shown in FIG. 6, the probe guide plate 1 of the first exemplary embodiment has the first silicon substrate 10, the first silicon oxide layer 12 and the second silicon substrate 20 in corresponding order from below.

At the central part A of the first silicon substrate 10, the plurality of first through-holes 10a penetrating the first silicon substrate from the upper surface to the lower surface is formed. Also, at the peripheral edge portion B of the first silicon substrate 10, the opening holes 10b penetrating the first silicon substrate from the upper surface to the lower surface are formed.

The second silicon oxide layer 30 is formed on both surfaces of the first silicon substrate 10 and the respective inner walls of the first through-holes 10a and opening holes 10b. The second silicon oxide layer 30 is formed by thermally oxidizing the first silicon substrate 10.

As shown in a partially enlarged sectional view of FIG. 6, a notch portion N having a notched shape is formed at an upper end portion of the inner wall of the first through-hole 10a. An inner surface of the notch portion N is inclined so that a height position thereof becomes lower from an upper end toward a lower end.

In the example of FIG. 6, the inner surface of the notch portion N has a concave curved shape. However, a convex curved shape can also be adopted. Alternatively, a shape close to a straight inclined surface can also be adopted.

By adjusting conditions of the anisotropic dry etching or the over etching amount when forming the first through-holes 10a in the first silicon substrate 10, the shape of the notch portion N to be formed at the upper end portion of the inner wall of the first through-hole 10a is changed.

Also, the first silicon oxide layer 12 is formed at the peripheral edge portion B of the first silicon substrate 10. The opening 12a of the first silicon oxide layer 12 is formed on the region in which the first through-holes 10a of the first silicon substrate 10 are arranged.

At the peripheral edge portion B of the first silicon oxide layer 12, the opening holes 12b configured to communicate with the opening holes 10b of the first silicon substrate 10 are arranged.

The first silicon oxide layer 12 is formed by thermally oxidizing the first silicon substrate 10. Alternatively, the first silicon oxide layer 12 may be formed of a glass substrate anodically bonded to the first silicon substrate 10.

Also, the second silicon substrate 20 is arranged on the first silicon oxide layer 12. At the central part A of the second silicon substrate 20, the plurality of second through-holes 20a penetrating the second silicon substrate from the upper surface to the lower surface is formed. The second through-holes 20a of the second silicon substrate 20 are arranged with being positioned at positions corresponding to the first through-holes 10a of the first silicon substrate 10.

Also in the second through-holes 20a of the second silicon substrate 20, the notch portions N are formed at lower end portions of the inner walls of the second through-holes 20a.

The inner wall of the opening 12a of the first silicon oxide layer 12 is arranged at the outermore side than the first through-holes 10a and the second through-holes 20a.

Also, the second silicon oxide layer 30 is formed on both surfaces of the second silicon substrate 20 and the inner walls of the second through-holes 20a and opening holes 20b. The second silicon oxide layer 30 is formed by thermally oxidizing the second silicon substrate 20.

In this way, the exposed surfaces of the first silicon substrate 10 and the second silicon substrate 20 are respectively formed with the second silicon oxide layer 30. Parts of the first silicon substrate 10 and the second silicon substrate 20, which are in contact with the first silicon oxide layer 12, are not formed with the second silicon oxide layer 30.

The first through-holes 10a of the first silicon substrate 10 and the second through-holes 20a of the second silicon substrate 20 are arranged to face each other with a space being interposed therebetween.

Also, the opening holes 20b configured to communicate with the opening holes 12b of the first silicon oxide layer 12 are formed at the peripheral edge portion B of the second silicon substrate 20.

The respective opening holes 10b, 20b of the first and second silicon substrates 10, 20 and the opening holes 12b of the first silicon oxide layer 12 communicate with each other, so that the through-holes for screw SH are formed. The inner wall of the through-hole for screw SH has an undercut shape that the inner wall of the first silicon oxide layer 12 extends outward (a diameter of the opening holes 12b of the first silicon oxide layer 12 is larger than a diameter of the corresponding opening holes 10b, 20b of the first and second silicon substrates 10, 20).

In this way, the peripheral edge portion B of the probe guide plate 1 is formed with the through-holes for screw SH penetrating therethrough.

FIG. 7 is a plan view of the probe guide plate 1 of FIG. 6, as seen from above. By referring to FIG. 6, in addition to FIG. 7, the plurality of second through-holes 20a is arranged side by side at the central part A of the second silicon substrate 20. The first through-holes 10a of the first silicon substrate 10 are respectively arranged just below the respective second through-holes 20a.

Also, the through-holes for screw SH are arranged at four places of the peripheral edge portion B of the probe guide plate 1.

When establishing a probe device by using the probe guide plate 1 of FIG. 6, it is necessary to insert probe terminals from the second through-holes 20a of the second silicon substrate 20 of the probe guide plate 1 into the first through-holes 10a of the first silicon substrate 10.

A sectional view of FIG. 8 pictorially depicts a situation where the probe terminal is inserted into the second through-hole 20a and the first through-hole 10a of the probe guide plate 1. In the example of FIG. 8, the second through-hole 20a and the first through-hole 10a of the probe guide plate 1 are arranged with slightly deviating from each other.

In the first exemplary embodiment, as described above, the notch portions N are formed at the upper end portions of the inner walls of the first through-holes 10a of the first silicon substrate 10, so that an opening diameter of the upper end of the first through-hole 10a is made larger. Also, the notch portion N is inclined downward from the upper end toward the lower end.

For this reason, as shown in FIG. 8, when the second through-hole 20a and the first through-hole 10a are arranged with slightly deviating from each other, a tip of a probe terminal 44 is contacted to an inner surface of the notch portion N formed at the upper end portion of the inner wall of the first through-hole 10a of the first silicon substrate 10.

Thereby, the probe terminal 44 is guided downward so that it slides from the inner surface of the notch portion N, and is easily inserted into the second through-hole 20b of the second silicon substrate 20, so that it can protrude downward.

In this way, when inserting the probe terminal 44 into the second through-hole 20a and the first through-hole 10a of the probe guide plate 1, it is possible to smoothly insert the probe terminal 44 without being caught at the upper end portion of the inner wall of the lower-side first through-hole 10a.

Also, when actually measuring electric characteristics of a testing target, the probe terminal 44 is bent, so that it slides on the inner wall of the first through-hole 10a, as if it rubs the same. At this time, since the first through-hole 10a of the probe guide plate 1 has the notch portion N, a problem that the probe terminal 44 is caught at the upper end portion of the inner wall of the first through-hole 10a or the upper end portion of the inner wall of the first through-hole 10a is damaged is solved.

FIG. 9 depicts a probe device 2 having the probe guide plate 1 of the first exemplary embodiment. As shown in FIG. 9, in the probe device 2 of the first exemplary embodiment, the probe guide plate 1 of FIG. 6 is arranged below an interconnection substrate 40.

In FIG. 9, the notch portions N of the inner walls of the first through-holes 10a and the second through-holes 20a of the probe guide plate 1 are omitted.

Fixing screws 48 are inserted and fixed from the through-holes for screw SH of the probe guide plate 1 into lower screw holes 40a of the interconnection substrate 40.

The interconnection substrate 40 has a substrate main body 42, probe terminals 44 and electrodes 46. The substrate main body 42 is formed of ceramics, silicon, glass, resin or the like. The probe terminals 44 penetrate the substrate main body 42 in a thickness direction thereof. The probe terminals 44 are formed of nickel, copper, gold, rhodium or the like.

One end of the probe terminal 44 is inserted into the two second through-hole 20a and first through-hole 10a of the probe guide plate 1, and the other end thereof is connected to the electrode 46 on the substrate main body 42. One end of the probe terminal 44 protrudes downward from the probe guide plate 1.

The electrodes 46 of the interconnection substrate 40 of the probe device 2 are electrically connected with terminals of an inspection device (not shown) such as a measurement device. A variety of test signals are supplied from the inspection device to the testing target via the interconnection substrate 40 of the probe device 2, so that the electric characteristics of the testing target are measured.

Below the probe device 2, a semiconductor chip 50, which is an example of the testing target, is arranged. Bump electrodes 52 are provided with being exposed on a surface of the semiconductor chip 50.

The plurality of probe terminals 44 of the probe device 2 is arranged in correspondence to the respective bump electrodes 52 of the semiconductor chip 50.

The semiconductor chip 50 is arranged on a stage (not shown) that can be positioned with respect to the probe device 2, and the probe terminals 44 of the probe device 2 and the bump electrodes 52 of the semiconductor chip 50 are positioned with respect to each other.

The probe device 2 is connected to a moving unit (not shown) and can be moved in a vertical direction. As the probe device 2 is moved downward, tips of the respective probe terminals 44 of the probe device 2 are contacted to the bump electrodes 52 of the semiconductor chip 50 with a predetermined pressure.

In this way, the probe terminals 44 of the probe device 2 are contacted to the bump electrodes 52 of the semiconductor chip 50, so that the electric characteristics of the semiconductor chip 50 are measured.

When assembling the probe device 2 of the first exemplary embodiment, it is necessary to insert the probe terminals 44 into the second through-holes 20a and first through-holes 10a arranged at the upper and lower sides of the probe guide plate 1. At this time, as described above with reference to FIG. 8, the notch portions N are formed at the upper end portions of the inner walls of the lower-side first through-holes 10a of the probe guide plate 1 of the first exemplary embodiment.

For this reason, even when the upper-side and lower-side first through-holes 10a and second through-holes 20a of the probe guide plate 1 are arranged with slightly deviating from each other, the tips of the probe terminals 44 are contacted to the notch portions N of the first through-holes 10a and can be thus smoothly inserted downward.

Also, even when the probe terminals 44 are inserted with deviating outward from centers of the lower-side first through-holes 10a of the probe guide plate 1, the probe terminals 44 can be smoothly inserted.

Also, when measuring the electric characteristics of the semiconductor chip 50, since the probe terminals 44 are bent, the inner walls of the first through-holes 10a and second through-holes 20a of the probe guide plate 1 are rubbed by the probe terminals 44.

Alternatively, when the probe terminals 44 are connected to a spring mechanism or the like in the interconnection substrate 40, the probe terminals 44 move up and down in the first through-holes 10a and the second through-holes 10a. For this reason, the inner walls of the first through-holes 10a and the second through-holes 20a are rubbed by the probe terminals 44.

At this time, if the upper end portions of the lower-side first through-holes 10a of the probe guide plate 1 are not formed with the notch portions N, unlike the first exemplary embodiment, the upper ends of the inner walls of the first through-holes 10a are formed as angled portions. For this reason, the probe terminals 44 are caught at the upper ends of the inner walls of the first through-holes 10a, so that the first silicon substrate 10 of the upper end portions of the first through-holes 10a may be damaged.

In the first exemplary embodiment, the notch portions N are formed at the upper end portions of the inner walls of the lower-side first through-holes 10a of the probe guide plate 1. For this reason, the situation where the probe terminals 44 are caught at the upper ends of the inner walls of the first through-holes 10a and the first silicon substrate 10 is thus damaged is prevented. As a result, it is possible to improve the reliability of the probe guide plate 1.

Also, in a probe guide plate formed of one silicon substrate, unlike the first exemplary embodiment, when the probe terminals slide upon the measurement of the electric characteristics, the silicon substrate may be damaged because the strength is not sufficient.

However, according to the probe guide plate 1 of the first exemplary embodiment, the first and second silicon substrates 10, 20 are bonded via the first silicon oxide layer 12, which is a spacer, and the substrate strength is thus reinforced. For this reason, when the probe terminals slide upon the measurement of the electric characteristics, it is possible to improve the reliability of the probe guide plate because the sufficient strength is secured.

(Second Exemplary Embodiment)

Figure 11A:
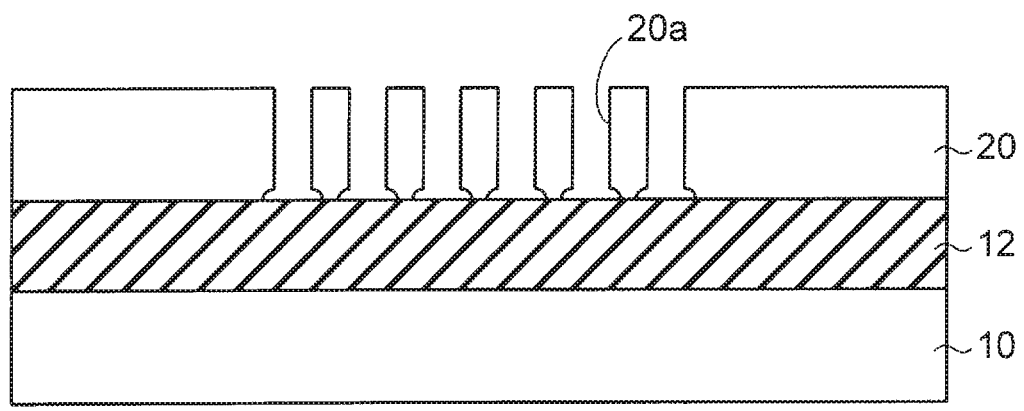
FIGS. 11A and 11B are sectional views depicting the manufacturing method of the probe guide plate in accordance with the second exemplary embodiment (2 thereof).
Figure 11B:
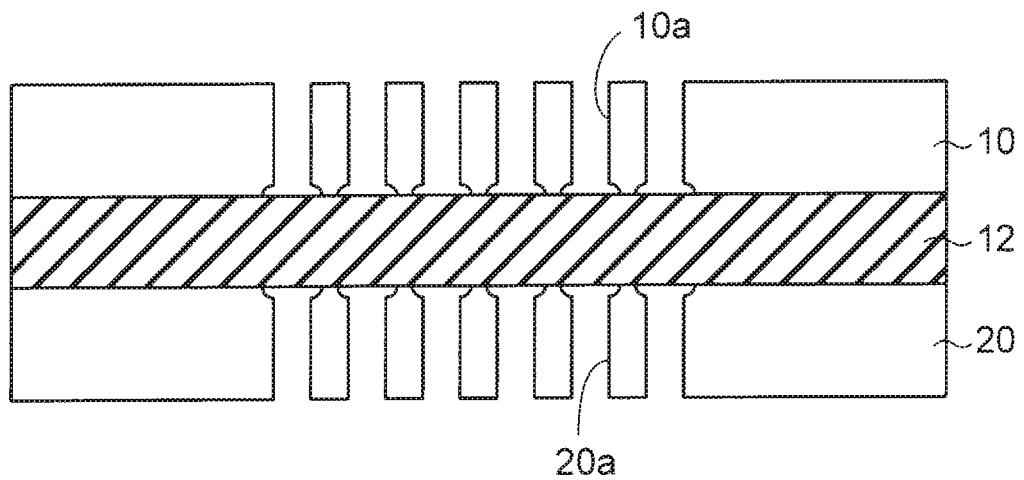
Figure 12A:
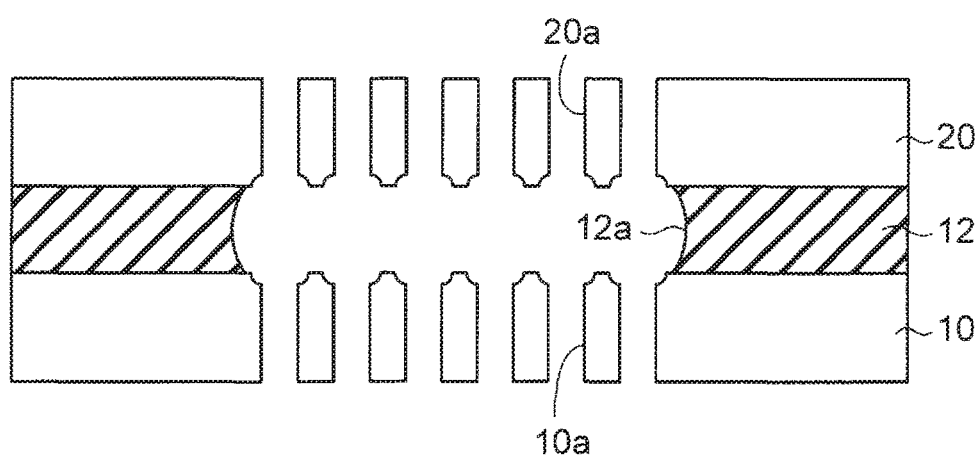
FIGS. 12A and 12B are sectional views depicting the manufacturing method of the probe guide plate in accordance with the second exemplary embodiment (3 thereof).
Figure 12B:
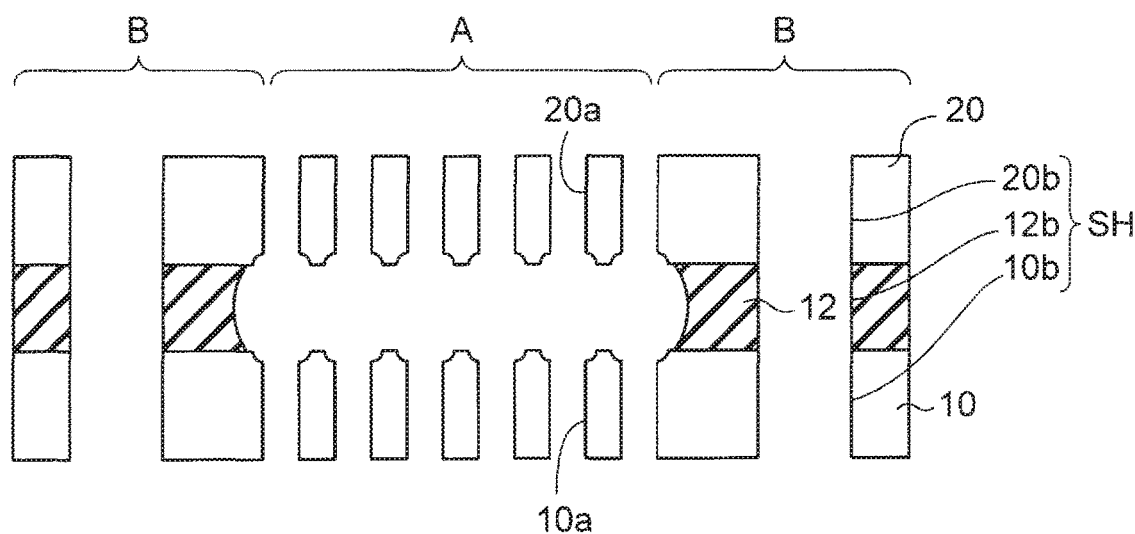
Figure 13:
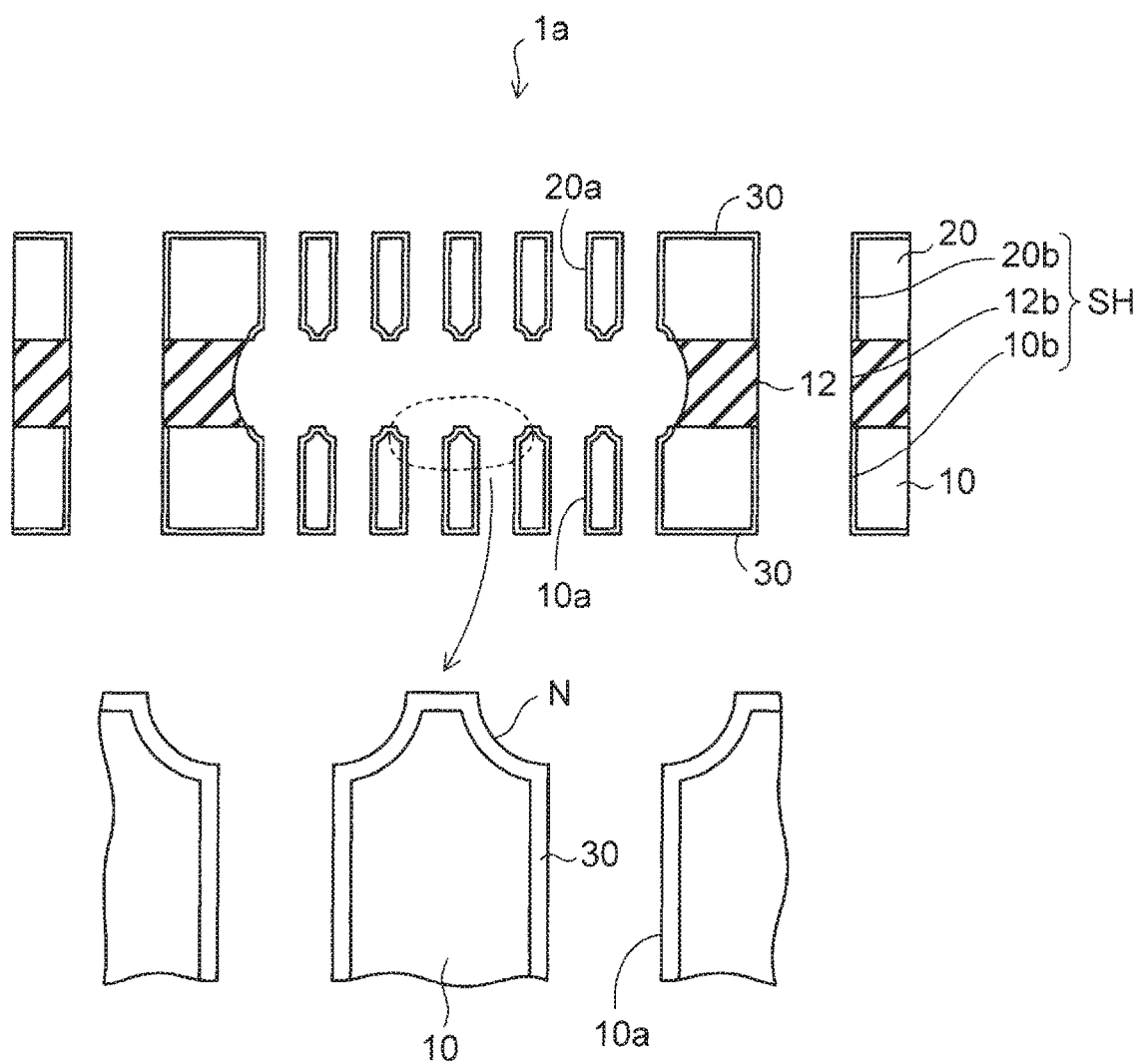
FIG. 13 is a sectional view depicting the probe guide plate of the second exemplary embodiment.

FIGS. 10A to 12B illustrate a manufacturing method of a probe guide plate in accordance with a second exemplary embodiment, and FIG. 13 depicts a probe guide plate of the second exemplary embodiment.

The second exemplary embodiment is different from the first exemplary embodiment, in that the through-holes for screw of the probe guide plate are collectively formed by a drill or laser.

Figure 10A:
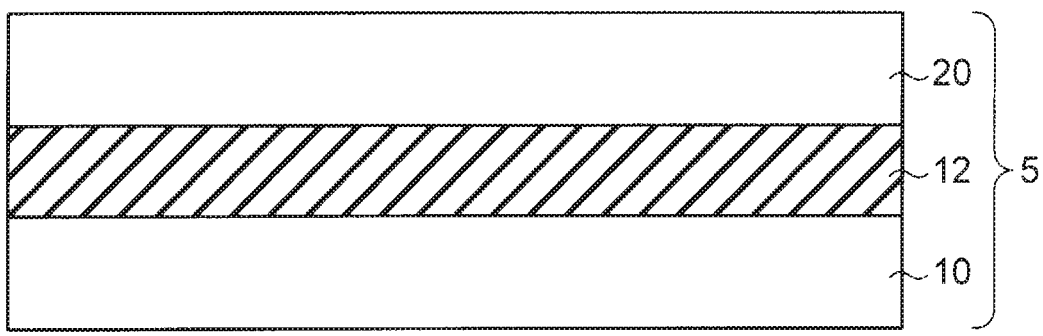
FIGS. 10A and 10B are sectional views depicting a manufacturing method of a probe guide plate in accordance with a second exemplary embodiment (1 thereof).

In the manufacturing method of the probe guide plate of the second exemplary embodiment, as shown in FIG. 10A, the silicon multi-layer substrate 5 having the same structure as FIG. 1A is first prepared.

Figure 10B:
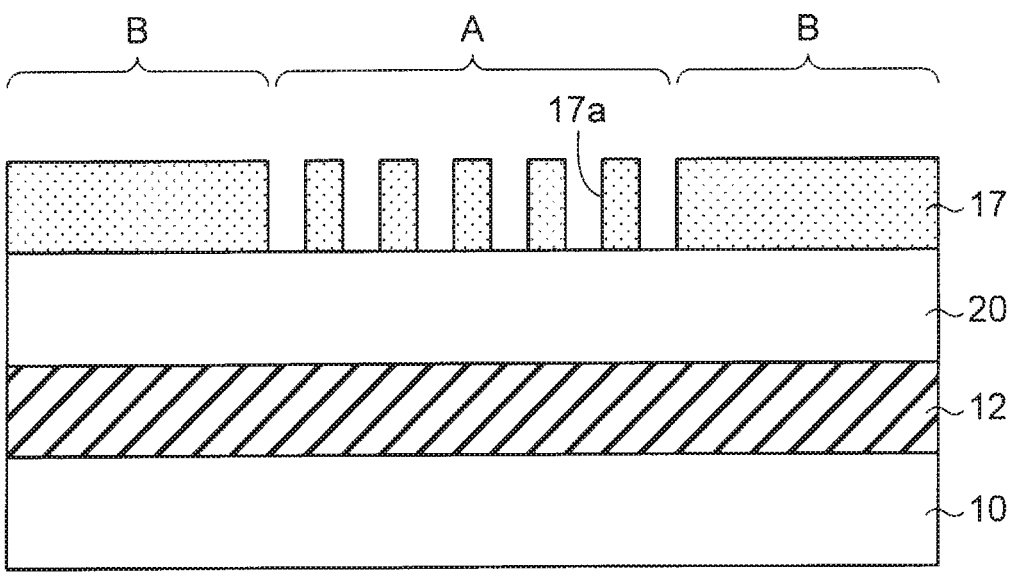

Then, as shown in FIG. 10B, a resist layer 17 having hole-shaped openings 17a is formed on the second silicon substrate 20 by the same method as the process of FIG. 1B.

At this time, in the second exemplary embodiment, the openings 17a of the resist layer 17 for forming through-holes are arranged at the central part A of the second silicon substrate 20, and openings of the resist layer 17 for forming the through-holes for screw are not arranged at the peripheral edge portion B of the second silicon substrate 20.

Subsequently, as shown in FIGS. 9B and 10A, the second silicon substrate 20 is etched up to the first silicon oxide layer 12 through the openings 17a of the resist layer 17 by the anisotropic dry etching, which is the same method as the process of FIG. 2A. Then, the resist layer 17 is removed.

Thereby, as shown in FIG. 11A, the second through-holes 20a penetrating the second silicon substrate 20 from the upper surface to the lower surface are formed at the central part A of the second silicon substrate 20.

Then, as shown in FIG. 11B, the structure of FIG. 11A is vertically inverted, so that the first silicon substrate 10 is arranged at the upper side. Then, like the processes of FIGS.

10B and 11A, the first through-holes 10a penetrating the first silicon substrate 10 from the upper surface to the lower surface are formed at the central part of the first silicon substrate 10.

Then, as shown in FIG. 12A, the structure of FIG. 11B is vertically inverted, so that the first silicon substrate 10 is arranged at the lower side. Subsequently, like the process of FIG. 4B, the first silicon oxide layer 12 exposed from the first silicon substrate 10 and the second silicon substrate 20 is etched by the dry etching using the hydrogen fluoride gas.

Thereby, like FIG. 4B, the collective opening 12a of the first silicon oxide layer 12 is formed on the region in which the first through-holes 10a of the first silicon substrate 10 are arranged. Then, the first through-holes 10a of the first silicon substrate 10 and the second through-holes 20a of the second silicon substrate 20 are arranged with being positioned at the positions corresponding to each other and face each other with a space being interposed therebetween.

Then, as shown in FIG. 12B, the peripheral edge portion B of the second silicon substrate 20 of the structure shown in FIG. 12A is penetrated from the upper surface thereof to the lower surface of the first silicon substrate 10 by a drill or laser, so that the through-holes SH for screw are formed.

The opening holes 10b of the first silicon substrate 10, opening holes 12b of the first silicon oxide layer 12 and the opening holes 20b of the second silicon substrate 20 are made to communicate with each other, so that the through-holes for screw SH are formed.

In the second exemplary embodiment, the structure of FIG. 12A is collectively processed from the upper surface to the lower surface by the drill or laser. For this reason, the first silicon oxide layer 12 is not side-etched on the inner walls of the through-holes for screw SH, and the inner walls of the through-holes for screw SH have a straight shape, respectively. A diameter of the opening hole 12b of the first silicon oxide layer 12 is the same as those of the respective opening holes 10b, 20b of the first silicon substrate 10 and the second silicon substrate 20.

Thereafter, as shown in FIG. 13, like FIG. 6, the structure of FIG. 12B is thermally oxidized, so that the second silicon oxide layer 30 is formed on the exposed surfaces of the first silicon substrate 10 and the second silicon substrate 20.

By the above, as shown in FIG. 13, a probe guide plate 1a of the second exemplary embodiment is obtained.

As shown in FIG. 13, according to the probe guide plate 1a of the second exemplary embodiment, the inner wall of the through-hole for screw SH has a straight shape from the upper end to the lower end.

In the probe guide plate 1a of FIG. 13, the elements except for the sectional shape of the through-hole for screw SH are the same as the probe guide plate 1 of the first exemplary embodiment shown in FIG. 6.

Like the first exemplary embodiment of FIG. 9, it is possible to establish the probe device by using the probe guide plate 1a of the second exemplary embodiment.

The probe guide plate 1a of the second exemplary embodiment has the same effects as the probe guide plate 1 of the first exemplary embodiment shown in FIG. 6.

Also, according to the second exemplary embodiment, since the through-holes for screw SH are formed in the separate process, it is disadvantageous in terms of the cost, as compared to the first exemplary embodiment. However, it is possible to form the inner wall of the through-hole for screw SH of the probe guide plate 1a into a straight shape.

For this reason, like the probe device 2 of FIG. 9, when screwing the fixing screws 48 into the interconnection substrate 40 from the through-holes for screw SH of the probe guide plate 1a, there is no concern that the rattling will occur and it is possible to make the screwing stronger.

This disclosure further encompasses various exemplary embodiments, for example, described below.

1. A manufacturing method of a probe guide plate, the method comprising:
preparing a silicon multi-layer substrate in which a first silicon substrate, an insulation layer and a second silicon substrate are stacked in corresponding order;
forming first through-holes in the first silicon substrate and forming second through-holes in the second silicon substrate in random order, and arranging the first through-holes and the second through-holes at positions corresponding to each other;
etching the insulation layer by an isotropic etching and forming an opening of the insulation layer on a region in which the first through-holes are arranged; and
forming a silicon oxide layer on exposed surfaces of the first silicon substrate and the second silicon substrate.

2. The manufacturing method of a probe guide plate according to claim 1, wherein in the forming the first through-holes and the second through-holes, the first through-holes and the second through-holes are formed by etching the first silicon substrate and the second silicon substrate with an anisotropic dry etching, respectively, and
wherein end portions of inner walls of the first through-hole and the second through-hole, which face toward the insulation layer, are formed with notch portions.

3. The manufacturing method of a probe guide plate according to claim 1, wherein in the forming the opening of the insulation layer, the isotropic etching is performed by a dry etching using a hydrogen fluoride gas.

4. The manufacturing method of a probe guide plate according to claim 1, wherein in the forming the first through-holes and the second through-holes, opening holes are respectively formed at positions corresponding to respective peripheral edge portions of the first silicon substrate and the second silicon substrate, and
wherein the forming the opening of the insulation layer comprises etching the insulation layer through the respective opening holes of the first silicon substrate and the second silicon substrate, thereby forming a through-hole for screw.

5. The manufacturing method of a probe guide plate according to claim 1, further comprising:
penetrating a peripheral edge portion of the second silicon substrate from an upper surface thereof to a lower surface of the first silicon substrate, thereby forming a through-hole for screw, after the forming the opening of the insulation layer and before the forming the silicon oxide layer.

What is claimed is:
1. A probe guide plate comprising:
a first silicon substrate having a first through-hole formed therein;
an insulation layer formed on the first silicon substrate and having an opening on a position in which the opening is overlapped with the first through-hole;
a second silicon substrate arranged on the insulation layer and having a second through-hole formed at a position in which the second through-hole is overlapped with the opening of the insulation layer; and
a silicon oxide layer formed on exposed surfaces of the first silicon substrate and the second silicon substrate,
wherein a diameter of the opening of the insulation layer is larger than a diameter of the first through-hole and a diameter of the second through-hole.

2. The probe guide plate according to claim 1, wherein the insulation layer is a silicon oxide layer.

3. The probe guide plate according to claim 1, wherein the first silicon substrate, the second silicon substrate and the insulation layer are directly bonded.

4. The probe guide plate according to claim 1, wherein the probe guide plate further comprises:
   notch portions formed at upper end portions of inner walls of the first through-hole of the first silicon substrate.

5. The probe guide plate according to claim 1, wherein a peripheral edge portion of the probe guide plate is formed with a through-hole for screw, and
   wherein an inner wall of the through-hole for screw of the probe guide plate has a straight shape or an undercut shape that a diameter of an opening hole for the through-hole for screw of the insulation layer is larger than a diameter of an opening hole for the through-hole for screw of the first silicon substrate.

6. The probe guide plate according to claim 1, wherein the second through-hole is disposed so that at least a part of the second through-hole is overlapped with the first through-hole.

7. The probe guide plate according to claim 1, wherein
   the first silicon substrate has a plurality of the first through-hole, and the second silicon substrate has a plurality of the second through-hole so that each of the second through-holes corresponds to a corresponding one of the first through-holes, and
   the plurality of the first through-holes and the plurality of the second through-holes are provided at the positions in which all of them are overlapped with the opening of the insulation layer.

8. A probe device comprising:
   a probe guide plate comprising:
   a first silicon substrate having a first through-hole formed therein,
   an insulation layer formed on the first silicon substrate and having an opening on a position in which the opening is overlapped with the first through-hole,
   a second silicon substrate arranged on the insulation layer and having a second through-hole formed at a position in which the second through-hole is overlapped with the opening of the insulation layer, and
   a silicon oxide layer formed on exposed surfaces of the first silicon substrate and the second silicon substrate, wherein a diameter of the opening of the insulation layer is larger than a diameter of the first through-hole and a diameter of the second through-hole; and
   a probe terminal inserted into the second through-hole from the first through-hole of the probe guide plate.

9. The probe device according to claim 8, the probe guide plate further comprises notch portions formed at upper end portions of inner walls of the first through-hole of the first silicon substrate.

10. The probe device according to claim 8, wherein the insulation layer is a silicon oxide layer.

11. The probe device according to claim 8, wherein the first silicon substrate, the second silicon substrate and the insulation layer are directly bonded.

12. The probe device according to claim 8, wherein the second through-hole is disposed so that at least a part of the second through-hole is overlapped with the first through-hole.

13. The probe device according to claim 8, wherein
   the first silicon substrate has a plurality of the first through-hole, and the second silicon substrate has a plurality of the second through-hole so that each of the second through-holes corresponds to a corresponding one of the first through-holes, and
   the plurality of the first through-holes and the plurality of the second through-holes are provided at the positions in which all of them are overlapped with the opening of the insulation layer.

\* \* \* \* \*